United States Patent
Hassan et al.

(10) Patent No.: US 8,923,340 B2
(45) Date of Patent: *Dec. 30, 2014

(54) SIGNALING TO APPLICATION LACK OF REQUESTED BANDWIDTH

(75) Inventors: Amer A. Hassan, Kirkland, WA (US); Thomas W. Kuehnel, Seattle, WA (US); Deyun Wu, Issaquah, WA (US); Christian Huitema, Clyde Hill, WA (US); D. Gabriel Frost, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/452,637

(22) Filed: Apr. 20, 2012

(65) Prior Publication Data

US 2012/0207233 A1 Aug. 16, 2012

Related U.S. Application Data

(63) Continuation of application No. 11/433,804, filed on May 12, 2006, now Pat. No. 8,189,621.

(51) Int. Cl.
*H04J 1/00* (2006.01)
*H04L 5/14* (2006.01)
*H04L 29/06* (2006.01)

(52) U.S. Cl.
CPC ............... *H04L 5/1446* (2013.01); *H04L 65/80* (2013.01)
USPC ........... 370/480; 370/329; 370/343; 370/344; 370/461

(58) Field of Classification Search
None
See application file for complete search history.

(56) References Cited

U.S. PATENT DOCUMENTS

| | | | |
|---|---|---|---|
| 3,343,093 | A | 9/1967 | Gerwen |
| 4,210,780 | A | 7/1980 | Hopkins et al. |
| 5,504,775 | A | 4/1996 | Chouly et al. |
| 5,729,535 | A | 3/1998 | Rostoker |
| 5,790,516 | A | 8/1998 | Gudmundson et al. |
| 5,867,478 | A | 2/1999 | Baum et al. |
| 6,175,550 | B1 | 1/2001 | van Nee |
| 6,295,272 | B1 | 9/2001 | Feldman |
| 6,304,611 | B1 | 10/2001 | Miyashita et al. |
| 6,456,653 | B1 | 9/2002 | Sayeed |

(Continued)

FOREIGN PATENT DOCUMENTS

| | | |
|---|---|---|
| CN | 1468486 | 1/2004 |
| CN | 1723676 | 1/2006 |

(Continued)

OTHER PUBLICATIONS

Atarashi, H., "Broadband packet wireless access appropriate for high-speed and high-capacity throughput," Vehicular Technology Conference, 2001, pp. 566-570, vol. 1, Issue 2001.

(Continued)

*Primary Examiner* — Jae Y Lee
(74) *Attorney, Agent, or Firm* — John Jardine; Kate Drakos; Micky Minhas

(57) ABSTRACT

A system for signaling an application when a requested data rate and Quality of Service cannot be achieved using OFDM wireless data transmission, and the application proceeds by either renegotiating QoS and data rate, or waiting until they requested rate and QoS are met.

20 Claims, 6 Drawing Sheets

(56) References Cited

U.S. PATENT DOCUMENTS

| | | | |
|---|---|---|---|
| 6,553,534 B2 | 4/2003 | Yonge et al. | |
| 6,609,039 B1 | 8/2003 | Schoen | |
| 6,654,431 B1 | 11/2003 | Barton et al. | |
| 6,704,572 B1 | 3/2004 | Whinnett | |
| 6,721,267 B2 | 4/2004 | Hiben | |
| 6,726,297 B1 | 4/2004 | Uesugi | |
| 6,728,551 B2 | 4/2004 | Chang | |
| 6,763,072 B1 | 7/2004 | Matsui et al. | |
| 6,810,006 B2 | 10/2004 | Michon et al. | |
| 6,870,808 B1 | 3/2005 | Liu et al. | |
| 6,882,851 B2 | 4/2005 | Sugar et al. | |
| 6,904,283 B2 | 6/2005 | Li et al. | |
| 6,934,246 B2 | 8/2005 | Park | |
| 6,934,340 B1 * | 8/2005 | Dollard | 375/260 |
| 6,952,454 B1 | 10/2005 | Jalali et al. | |
| 6,961,388 B2 | 11/2005 | Ling et al. | |
| 6,976,202 B1 | 12/2005 | Rezvani et al. | |
| 6,987,729 B1 | 1/2006 | Gopalakrishnan et al. | |
| 7,012,883 B2 | 3/2006 | Jalali et al. | |
| 7,020,071 B2 | 3/2006 | Mujtaba | |
| 7,020,073 B2 | 3/2006 | Kadous et al. | |
| 7,043,023 B2 | 5/2006 | Watanabe et al. | |
| 7,043,681 B2 | 5/2006 | Kroeger et al. | |
| 7,047,032 B2 | 5/2006 | Yun | |
| 7,072,413 B2 | 7/2006 | Walton et al. | |
| 7,075,967 B2 | 7/2006 | Struhsaker et al. | |
| 7,076,246 B2 | 7/2006 | Chitrapu | |
| 7,126,984 B2 | 10/2006 | Wang | |
| 7,133,471 B2 | 11/2006 | Feher | |
| 7,151,755 B2 | 12/2006 | Xu | |
| 7,151,925 B2 | 12/2006 | Ting et al. | |
| 7,164,649 B2 | 1/2007 | Walton et al. | |
| 7,206,350 B2 | 4/2007 | Korobkov et al. | |
| 7,206,840 B2 | 4/2007 | Choi et al. | |
| 7,286,603 B2 | 10/2007 | Varshney | 375/260 |
| 7,333,531 B2 | 2/2008 | Alamouti | |
| 7,356,343 B2 | 4/2008 | Feher | |
| 7,414,964 B2 | 8/2008 | Hashem | |
| 7,415,085 B2 | 8/2008 | Fujii | |
| 7,450,559 B2 | 11/2008 | Schotten | |
| 7,551,641 B2 | 6/2009 | Pirzada | |
| 7,623,599 B2 | 11/2009 | McCoy | |
| 7,627,048 B2 | 12/2009 | Larsson | |
| 7,634,016 B2 | 12/2009 | Hassan | |
| 7,672,221 B2 | 3/2010 | Fuji | |
| 7,672,381 B1 | 3/2010 | Kleider | |
| 7,800,541 B2 | 9/2010 | Moshfeghi | |
| 7,813,701 B2 | 10/2010 | Strong | |
| 7,855,948 B2 | 12/2010 | Anikhindi | |
| 7,877,110 B2 | 1/2011 | Feher | |
| 7,929,623 B2 | 4/2011 | Hassan | |
| 7,933,344 B2 | 4/2011 | Hassan | |
| 7,970,085 B2 | 6/2011 | Hassan | |
| 8,072,957 B2 | 12/2011 | Gross | |
| 8,144,793 B2 | 3/2012 | Hassan | |
| 8,166,534 B2 | 4/2012 | Yariv | |
| 8,189,621 B2 | 5/2012 | Hassan | |
| 8,228,850 B2 | 7/2012 | McBeath | |
| 8,249,001 B2 | 8/2012 | Oota | |
| 8,311,140 B2 | 11/2012 | Feher | |
| 8,320,506 B2 | 11/2012 | Jo | |
| 2002/0119781 A1 | 8/2002 | Li | |
| 2002/0141446 A1 * | 10/2002 | Koga | 370/468 |
| 2002/0157058 A1 | 10/2002 | Ariel | |
| 2002/0188723 A1 | 12/2002 | Choi et al. | |
| 2003/0015423 A1 | 1/2003 | LaGreca et al. | |
| 2003/0026200 A1 | 2/2003 | Fu et al. | |
| 2003/0058786 A1 | 3/2003 | Sato et al. | |
| 2003/0067961 A1 | 4/2003 | Hudson | |
| 2003/0112880 A1 | 6/2003 | Walton | |
| 2003/0123383 A1 | 7/2003 | Korobkov et al. | |
| 2003/0154233 A1 | 8/2003 | Patterson | |
| 2003/0223354 A1 | 12/2003 | Olszewski | |
| 2004/0005010 A1 | 1/2004 | He et al. | |
| 2004/0008618 A1 | 1/2004 | Shirakata et al. | |
| 2004/0027997 A1 | 2/2004 | Terry et al. | |
| 2004/0029575 A1 | 2/2004 | Mehta | |
| 2004/0073929 A1 * | 4/2004 | Morello | 725/63 |
| 2004/0151108 A1 | 8/2004 | Blasco Claret et al. | |
| 2004/0151109 A1 | 8/2004 | Batra et al. | |
| 2004/0252775 A1 | 12/2004 | Park | |
| 2004/0252781 A1 | 12/2004 | Park | |
| 2005/0002325 A1 | 1/2005 | Giannakis et al. | |
| 2005/0013238 A1 | 1/2005 | Hansen | |
| 2005/0025039 A1 | 2/2005 | Hwang et al. | |
| 2005/0027789 A1 | 2/2005 | Luo et al. | |
| 2005/0047259 A1 * | 3/2005 | Ahn et al. | 365/232 |
| 2005/0063345 A1 | 3/2005 | Wu et al. | |
| 2005/0078759 A1 | 4/2005 | Zhang | |
| 2005/0085249 A1 | 4/2005 | Goldstein | |
| 2005/0099937 A1 | 5/2005 | Oh et al. | |
| 2005/0111462 A1 | 5/2005 | Walton et al. | |
| 2005/0117661 A1 | 6/2005 | Kim | |
| 2005/0130684 A1 | 6/2005 | Kim et al. | |
| 2005/0141649 A1 | 6/2005 | Tanabe | |
| 2005/0152466 A1 | 7/2005 | Maltsev et al. | |
| 2005/0157670 A1 | 7/2005 | Tang et al. | |
| 2005/0157805 A1 | 7/2005 | Walton | |
| 2005/0160428 A1 | 7/2005 | Ayachitula et al. | |
| 2005/0180313 A1 | 8/2005 | Kim | |
| 2005/0197132 A1 | 9/2005 | Lee et al. | |
| 2005/0228850 A1 | 10/2005 | Zhu et al. | |
| 2005/0232208 A1 | 10/2005 | Hansen | |
| 2005/0237989 A1 | 10/2005 | Ahn et al. | |
| 2005/0245197 A1 | 11/2005 | Kadous et al. | |
| 2005/0249127 A1 | 11/2005 | Huo | |
| 2006/0009209 A1 | 1/2006 | Rieser et al. | |
| 2006/0034382 A1 | 2/2006 | Ozluturk et al. | |
| 2006/0045001 A1 | 3/2006 | Jalali | |
| 2006/0046716 A1 | 3/2006 | Hofstaedter et al. | |
| 2006/0063543 A1 * | 3/2006 | Matoba et al. | 455/509 |
| 2006/0067288 A1 | 3/2006 | Shim | |
| 2006/0078059 A1 | 4/2006 | Ok et al. | |
| 2006/0083157 A1 | 4/2006 | Cheng | |
| 2006/0083210 A1 | 4/2006 | Li et al. | |
| 2006/0094372 A1 * | 5/2006 | Ahn et al. | 455/67.13 |
| 2006/0126493 A1 | 6/2006 | Hashem | 370/208 |
| 2006/0128318 A1 * | 6/2006 | Agarossi et al. | 455/69 |
| 2006/0135075 A1 | 6/2006 | Tee et al. | |
| 2006/0154691 A1 | 7/2006 | Tang et al. | |
| 2006/0159120 A1 * | 7/2006 | Kim | 370/465 |
| 2006/0171445 A1 | 8/2006 | Batra et al. | |
| 2006/0188031 A1 | 8/2006 | Liu | |
| 2006/0193295 A1 | 8/2006 | White et al. | |
| 2006/0211387 A1 | 9/2006 | Pisek et al. | |
| 2006/0211395 A1 | 9/2006 | Waltho | |
| 2006/0234752 A1 | 10/2006 | Mese | |
| 2006/0250944 A1 | 11/2006 | Hong et al. | |
| 2006/0269005 A1 | 11/2006 | Laroia et al. | |
| 2006/0287001 A1 | 12/2006 | Budampati et al. | |
| 2007/0009056 A1 | 1/2007 | Yeon et al. | |
| 2007/0016413 A1 | 1/2007 | Seo et al. | |
| 2007/0055501 A1 * | 3/2007 | Aytur et al. | 704/219 |
| 2007/0058583 A1 | 3/2007 | Cho | |
| 2007/0078924 A1 | 4/2007 | Hassan et al. | |
| 2007/0133387 A1 | 6/2007 | Arslan et al. | |
| 2007/0189162 A1 | 8/2007 | Song | |
| 2008/0232340 A1 | 9/2008 | Wan et al. | |
| 2009/0086706 A1 | 4/2009 | Huang | |
| 2009/0190535 A1 | 7/2009 | Hassan | |
| 2010/0040167 A1 | 2/2010 | Aoki | |
| 2010/0165956 A1 | 7/2010 | Razzell | |
| 2011/0173485 A1 | 7/2011 | Hassan | |
| 2011/0235732 A1 | 9/2011 | Hassan | |
| 2012/0182875 A1 | 7/2012 | Hassan | |
| 2012/0201317 A1 | 8/2012 | Hassan | |

FOREIGN PATENT DOCUMENTS

| | | |
|---|---|---|
| CN | 1874334 | 12/2006 |
| EP | 1 156 598 A2 | 11/2001 |
| EP | 1 560 344 | 8/2005 |
| EP | 1 571 773 A2 | 9/2005 |
| EP | 1 578 162 | 9/2005 |

(56) References Cited

FOREIGN PATENT DOCUMENTS

| | | |
|---|---|---|
| JP | 08-047036 | 2/1996 |
| JP | 2001-285236 | 10/2001 |
| JP | 2004-158965 | 6/2004 |
| JP | 2005-167502 | 6/2005 |
| JP | 2005-244997 | 9/2005 |
| JP | 2005-260921 | 9/2005 |
| JP | 2006-287344 | 10/2006 |
| KR | 1020050052847 A | 6/2005 |
| NZ | 505658 | 2/2003 |
| RU | 2 219 665 | 12/2003 |
| TW | I256789 | 6/2006 |
| TW | I257779 | 7/2006 |
| WO | WO 96/23371 | 8/1996 |
| WO | WO 00/74415 | 12/2000 |
| WO | 02/32161 | 4/2002 |
| WO | WO 02/33925 | 4/2002 |
| WO | WO 02/49306 | 6/2002 |
| WO | WO 02093839 A1 | 11/2002 |
| WO | WO 03/088602 | 10/2003 |
| WO | WO 2004/007549 | 9/2004 |
| WO | 2005/060192 A1 | 6/2005 |
| WO | WO 2005/066914 | 7/2005 |
| WO | WO 2005125250 A1 | 12/2005 |
| WO | 2006/004466 | 1/2006 |
| WO | WO 2007/062754 | 6/2007 |
| WO | WO 2005076557 A1 | 8/2007 |
| WO | WO 2007/108077 | 9/2007 |

OTHER PUBLICATIONS

Brodersen, Robert W., et al. "Corvus: a cognitive radio approach for usage of virtual unlicensed spectrum." Online. http://www.tkn.tu-berlin.de/publications/papers/CR_White_paper_final.pdf.
Chiani, Marco, et al., "Ultra Wide Bandwidth Communications Towards Cognitive Radio." Online. http://www-csite.deis.unibo.it/Staff/giorgetti/pubblicazioni/Conferences/emc05_mcaggl.pdf.
Johnsson, Martin, "HiperLAN/2—The Broadband Radio Transmission Technology Operating in the 5 GHz Frequency Band," HiperLAN/2 Global Forum, 1999, Version 1.0.
Krenik, William et al., "Cognitive Radio Techniques for Wide Area Networks," Annual ACM IEEE Design Automation Conference, Proceedings of the 42nd Annual Conference on Design Automation, 2005, pp. 409-412, San Diego, USA, ISBN:1-59593-058-2.
Mitola, J., et al. "Cognitive Radio: Making Software Radios More Personal," Personal Communications, IEEE, Aug. 1999, vol. 6, Issue 4, pp. 13-18, Stockholm, Sweden, ISSN: 1070-9916.
Okada, M., et al., "Pre-DFT Combining Space Diversity Assisted COFDM," IEEE Transactions on Vehicular Technology, Mar. 2001, pp. 487-496, vol. 50, No. 2, ISSN: 0018-9545.
Pottie, Gregory J., "Wireless Multiple Access Adaptive Communications Techniques," Online. http://www.ee.ucla.edu/~pottie/papers/encycl.pdf.
Tewfik, A.H, et al., "High Bit Rate Ultra-Wideband OFDM," Global Telecommunications Conference, 2002. GLOBECOM apos;02. IEEE, Nov. 2002, pp. 2260-2264, vol. 3.
Wang, Zhengdao, et al., "Complex-Field Coding for OFDM Over Fading Wireless Channels," IEEE Transactions on Information Theory, Mar. 2003, pp. 707-720, vol. 49, No. 3, ISSN: 0018-9448.
Xiaoming She, et al., "Adaptive Turbo Coded Modulation for OFDM Transmissions," Communication Technology Proceedings, 2003. ICCT 2003., Apr. 9-11, 2003, pp. 1491-1495, vol. 2, Beijing, China.
"About SDR Technology," 1 http://www.sdrforum.org/pages/aboutSdrTech/aboutSdrTech.asp, 1 pg, 2007.
"Orthogonal Frequency Division Multiple Access," Wikipedia Online Encyclopedia; retrieved from http://en.wikipedia.org/wiki/ofdma, published Nov. 25, 2006, downloaded on Dec. 12, 2006, pp. 1-3.
"Software defined radio," http://www.wipro.com/webpages/insights/softwareradio.htm, 1 pg, 2007.
"Software Defined Radio", http://www.altera.com/end-markets/wireless/software/sdr/wir-sdr.html, 4 pgs.

Baumgartner, et al., "Performance of Forward Error Correction for IEEE 802.16e," 10th International OFDM Workshop, Hamburg, Germany, Aug. 2005.
Blestas et al., "Efficient Collaborative (Viral) Communication in OFDM Based WLANs", Proceedings of IEEE/ITS International Symposium on Advanced Radio Technologies (ISART 2003), Institute of Standards and Technology, Boulder Colorado, Mar. 4-7, 2003, pp. 27-32.
Cabric, et al., "A Cognitive Radio Approach for Usage of Virtual Unlicensed Spectrum," In Proc. of 14th IST Mobile Wireless Communications Summit 2005, Dresden Germany, Jun. 2005, 4 pages unnumbered.
Goeckel, et al., "On the Design of Multidimentional Signal Sets for OFDM Systems," IEEE Transactions on Communications, vol. 50 No. 3, pp. 442-452, Mar. 2002.
Goeckel, "Coded Modulation With Non-Standard Signal Sets for Wireless OFDM Systems," IEEE, pp. 791-795, 1999.
International Search Report from International Application No. PCT/US2007/010020, Search dated Nov. 5, 2007.
International Search Report from International Application No. PCT/US2007/085556, Search dated Mar. 26, 2008.
International Search Report from International Application No. PCT/US2007/011642, Search dated Sep. 28, 2007.
International Search Report from International Application PCT/US2007/010021, Search dated Oct. 10-17, 2007.
Lawrey, et al., "Adaptive Frequency Hopping for Multiuser OFDM," Second International Conference on Information, Communications & Signal Processing, ICICS '99, Singapore, Dec. 7-10, 1999.
Li, et al., "Clustered OFDM with Channel Estimation for High Rate Wireless Data," IEEE, 1999, pp. 43-50.
Mitola, III, et al., "Cognitive Radio an Integrated Agent Architecture for Software Defined Radio," *Royal Institute of Technology (KTH)*, Teleinformatics Electrum 204, SE-164 40 Kista Sweden, pp. title page through 304, May 8, 2000.
Mitola, et al., Absract from "Cognitive Radio: Making Software Radios More Personal," Personal Communications, IEEE, Aug. 1999, vol. 6, Issue 4, pp. 13-18, Stockholm, Sweden, ISSN: 1070-9916.
Okada, et al., "Pre-DFT Combining Space Diversity Assisted COFDM," IEEE Transactions on Vehicular Technology, vol. 50, No. 2, pp. 487-496, Mar. 2001.
Sereni et al., "A Software *Radio OFDM* Transceiver for WLAN Applications," Electronic and Information Engineering Department(DIEI)-University of Perugia—Italy, pp. 1-14, Apr. 2001.
Wahlqvist, et al., "A Conceptual Study of OFDM-based Multiple Access Schemes," Telia, Jun. 5, 1996. http://www.es.lth.se/home/oes/pdfs/etsil.pdf.
Wong, et al., "Multiuser OFDM with Adaptive Subcarrier, Bit, and Power Allocation," *IEEE Journal on Selected Areas in Communications*, vol. 17, No. 10, Oct. 1999, pp. 1747-1758.
Written Opinion from International Application No. PCT/US2007/010020, Search dated Nov. 5, 2007.
Written Opinion from International Application No. PCT/US2007/085556, Search dated Mar. 26, 2008.
Written Opinion from International Application No. PCT/US2007/011642, Search dated Sep. 28, 2007.
Written Opinion from International Application PCT/US2007/010021, Search dated Oct. 17, 2007.
Youngblood, "A Software-Defined Radio for the Masses, Part 1," http://www.ece.jhu.edu/~cooper/SWRadio/Yblood1.pdf, Jul./Aug. 2002, pp. 1-9.
Zhang, et al., "Adaptive OFDM System Design for Cognitive Radio," In: 11th International OFDM-Workshop, Aug. 30-31, 2006, Hamburg, Germany, pp. 91-95, IEEE Communications Society.
Taiwan Search Report for TW 096116940, dated Sep. 8, 2010, 1 page.
EP Communication for Application No. 08747424.3-1525 / 2143222 PCT/US2008062321, reference FB22296, Aug. 22, 2012.
Rhee, Increase in Capacity of Multiuser OFDM System Using Dynamic Subchannel Allocation, May 15, 2000. XP-000968037.
CN Notice on the First Office Action for Application No. 200780016912.6, Mar. 31, 2012.

(56) References Cited

OTHER PUBLICATIONS

CN Notice on the First Office Action for Application No, 200880015382.8, Jun. 5, 2012.
JP Notice of Reason for Rejection for Application No. 2009-507775, Mar. 21, 2012.
JP Notice of Reason for Rejection for Application No. 2009-509894, Mar. 21, 2012.
CN Notice on the Second Office Action for Application No. 200780045500.5, Nov. 9, 2012.
CN Notice on the First Office Action for Application No. 200780015172.4, Dec. 30, 2010.
AU Examiner's First Report for Application No. 2007243348, Reference 30652319/DBW, May 24, 2010.
EP Communication for Application No. 08747424.3-1505, Reference FB22296, Apr. 10, 2013.
CN Notice on the First Office Action for Application No. 200880125896.9, Aug. 27, 2012.
PCT International Search Report and Written Opinion for Application No. PCT/US2008/087860, Reference 321714.02 WO, May 21, 2009.
Alonistioti, "End-to-End Reconfigurability: Evolution on Reconfiguration Metamodel", OMG SBC 2005, Aug. 17, 2005.
Bard, "Joint Tactical Radio System", Space Coast Communication Systems Inc., Sep. 9, 2003.
Bourse, "End-To-End Reconfigurabiiity (E2R): Enabling Interoperability, Management and Control of Complex Heterogeneous Systems", URSI GA 2005, Oct. 25, 2005.
Schiphorst, "A Bluetooth-enabled HiperLAN/2 receiver.", Proceedings of the IEEE 58th Vehicular Technology Conference, Oct. 6-9, 2003.
Sgandurra, "Achieving SCA Compliance for COTS Software Defined Radio, Second Edition", Pentek, Apr. 11, 2006.
KR Notice of Preliminary Rejection and Reasons for Rejection for Application No. 10-2008-7025732, Reference No. 316361.13, Jun. 30, 2013.
CN Notice on the Second Office Action for Application No. 200780016912.6, Jan. 7, 2013.
CN Notice on the Second Office Action for Application No. 200880125896.9, Dec. 19, 2012.
CN Decision on Rejection for Application No. 200780045500.5, Feb. 5, 2013.
CN Notice on the Second Office Action for Application No. 200880015382.8, Feb. 8, 2013.
EP Communication for Application No. 07777062.6-1854 / 2018718 PCT/US2007011642, Reference FB20744, Mar. 8, 2013.
JP Notification of Reason for Rejection for Application No. 2010-544299, Apr. 16, 2013.
TW Search Report for Application No. 096114706. Date of Research: Mar. 14, 2013.
CN Notice on the First Office Action for Application No. 200780045500.5, Jan. 31, 2012.
JP Notice of Rejection for Application No. 2009-541463, Oct. 19, 2012.
AU Examiner's First Report for Application No. 2007333404, Reference 30781604/DBW, Aug. 18, 2010.
Tejera, "Subchannel Allocation in Multiuser Multiple Input Multiple Output Systems", IEEE Transactions on Information Theory, Jul. 4, 2006.
JP Notification of reason for rejection for Application No. 2010-544299, Drafting date Jul. 29, 2013.
CN Decision on Rejection for Application No. 200880125896.9, Jul. 29, 2013.
KR Notice of Preliminary Rejection for Application No. 10-2009-7014172, Nov. 25, 2013.
CN Notice on the Third Office Action for Application No. 200880015382.8, Aug. 22, 2013.
CN Decision on Rejection for Application No. 200880125896.9, Summary of the Final Rejection included, Jul. 29, 2013.
EP Summons to attend oral proceeding for Application No. 08747424.3 1505 / 2143222, Reference FB22296, Sep. 9, 2013.
U.S. Appl. No. 11/433,804, filed May 12, 2006, Hassan.
U.S. Appl. No. 13/449,312, filed Apr. 18, 2012, Hassan.
U.S. Appl. No. 11/410,969, filed Apr. 25, 2006, Hassan.
U.S. Appl. No. 11/637,449, filed Dec. 12, 2006, Hassan.
U.S. Appl. No. 13/427,494, filed Mar. 22, 2012, Hassan.
U.S. Appl. No. 11/731,269, filed Mar. 30, 2007, Hassan.
U.S. Appl. No. 13/052,667, filed Mar. 21, 2011, Hassan.
U.S. Appl. No. 60/928,114, filed May 8, 2007, Hassan.
U.S. Appl. No. 11/899,248, filed Sep. 5, 2007, Hassan.
U.S. Appl. No. 13/153,801, filed Jun. 6, 2011, Hassan.
U.S. Appl. No. 12/020,212, filed Jan. 25, 2008, Hassan.
U.S. Appl. No. 13/763,671, filed Feb. 9, 2013, Hassan.
JP Secondary Office Action for Application No. 2009-541463, Dec. 3, 2013.
JP Office Action for Application No. 2009-541463, Jul. 19, 2013.
EP Summons to attend oral proceedings for Application No. 08747424.3-1505 / 2143222, Reference FB22296, Jan. 17, 2014.
CN Notice on the Third Office Action for Application No. 200880015382.8, Summary of the Third Office Action included. Aug. 22. 2013.
EP Communication for Application No. 08871573.5-1851 / 2232804 PCT/US2008087860, Reference FB23204, Jun. 18, 2014.
Akyildiz, "NeXt generation/dynamic spectrum access/cognitive radio wireless networks: A survey", Computer Networks, Elsevier Science Publishers, May 17, 2006.
Fujii, "Multicarrier Assignment with Random pulse for Multicarrier High Speed Decentralized Wireless LAN", The 8th IEEE International Symposium on Personal, Indoor and Mobile Radio Communications, 1997, Waves of the Year 2000, (PIMRC '97), Sep. 1-4, 1997.
EP Communication for Application No. 07854775.9-1860 / 2127144 PCT/US2007085556, Reference EP65237TE900kap, May 12, 2014.
Kivanc, "Subcarrier Allocation and Power Control for OFDMA", Conference Record of the Thirty-Fourth Asilomar Conference on Signals, Systems and Computers, Oct. 29-Nov. 1, 2000.
KR Notice of Preliminary Rejection for Application No. 10-2014-7000529, Feb. 10, 2014.
TW Search Report for Application No. 097150662, Dec. 20, 2013.
CN Notice on the Fourth Office Action for Application No. 200880015382.8, Mar. 14, 2014.
EP Provision of Application No. 08747424.3-1505, Reference FB22296, Feb. 14, 2014.
EP Decision to refuse for Application No. 08747424.3-1505, Reference FB22296, Feb. 14, 2014.
EP Communication for Application No. 07794366.0-1860 / 2011296 PCT/US2007010020, Reference FB20700, Apr. 8, 2014.
Kivanc, "Computationally Efficient Bandwidth Allocation and Power Control for OFDMA", IEEE Transactions on Wireless Communications, vol. 2, No. 6, Nov. 2003.
Yin, "An Efficient Multiuser Loading Algorithm for OFDM-based Broadband Wireless Systems", Proceedings of the Global Telecommunications Conference, Nov. 27-Dec. 1, 2000.

\* cited by examiner

SIGNALING TO APPLICATION LACK OF REQUESTED BANDWIDTH

RELATED APPLICATIONS

This Application claims the benefit under 35 U.S.C. §120 of U.S. application Ser. No. 11/433,804, entitled "STACK SIGNALING TO APPLICATION LACK OF REQUESTED BANDWIDTH" filed on May 12, 2006, which is herein incorporated by reference in its entirety.

BACKGROUND OF INVENTION

1. Field of Invention

The invention relates generally to wireless communication and more particularly to a system for notifying a communication application that a requested data rate and quality of service are not available.

2. Discussion of Related Art

Frequency Division Multiplexing (FDM) is a well known process by which multiple signals are modulated on different frequency carrier waves. FDM has been used for decades in radio and television broadcast. Radio and television signals are sent and received on different frequencies, each corresponding to a different "channel."

Orthogonal Frequency Division Multiplexing (OFDM) has also been known in the art at least since the late 1960's. In OFDM, a single transmitter transmits simultaneously on many different orthogonal frequencies. Orthogonal frequencies are frequencies that are independent with respect to the relative phase relationship between the frequencies. In OFDM, the available bandwidth is subdivided into a number of equal-bandwidth "subchannels." OFDM is advantageous for wireless communication because it has robust performance in multipath fading. In general, OFDM based systems do not require an equalizer for reliable communications. OFDM is employed in many standards used today for wireless communication. For example, both the IEEE 802.11a wireless LAN Standard and the 802.11g wireless LAN standard rely on an implementation of OFDM for signal transmission. The next generation 802.11n wireless LAN Standard, UWB wireless PAN Standard, and mobile WiMAX all use OFDM modulation for high rate communications. One early reference describing OFDM is R. W. Chang, Synthesis of band-limited orthogonal signals for multi-channel data transmission, Bell System Technical Journal (46), 1775-1796 (1966).

OFDM thus functions by breaking one high speed data stream into a number of lower-speed data streams, which are then transmitted in parallel (i.e., simultaneously). Each lower speed stream is used to modulate a subcarrier. This creates a "multi-carrier" transmission by dividing a wide frequency band (or channel) into a number of narrower frequency bands (or subchannels), each modulated with a signal stream. By sending multiple signal streams simultaneously, each at a lower rate, multipath or Raleigh fading can be reduced or eliminated without decreasing the overall rate of transmission.

OFDM is also implemented in a variety of communications systems occurring over wires. For example, OFDM is used in Asymmetric Digital Subscriber Line (ADSL) connections that adhere to the ITU G.992.1 standard. In the ADSL context, OFDM is sometimes referred to as Discrete Multitone Modulation, or DMT. OFDM is also often used to modulate signals to be transmitted over power wires. For example, the HomePlug powerline alliance established a standard for communication over power lines in a home. The HomePlug standard uses OFDM modulation.

Over the past several years, numerous network applications have come into common use that require certain transmission characteristics to work effectively. For example, Voice-over-IP (VoIP) communication, also known as IP Telephony, Internet Telephony, or Broadband Phone, is a telephone-like system that works entirely or partially over the Internet by converting a voice signal into a digital signal that can be transmitted in Internet packets. VoIP traffic requires a minimum data transfer rate to be useable for communication. Similarly, the transmission of video content (for example, video teleconferencing or streaming multimedia) over a network typically requires certain minimum transmission characteristics to be viewable.

When the Internet was first created, there were no systems in place to insure minimum transmission characteristics. Over time, standards for Quality of Service (QoS) have developed to provide guaranteed transmission characteristics such as minimum performance or throughput, or maximum latency. QoS can be implemented within a local network or over a broader area. One reference discussing QoS is the IEEE 802.1p standard, which is implemented at the media access control (MAC) framing layer on the protocol stack.

SUMMARY OF INVENTION

This Summary provides an illustrative context for aspects of the invention, in a simplified form. It is not intended to be used to determine the scope of the claimed subject matter. Aspects of the invention are described more fully below in the Detailed Description.

Described herein are systems and methods for selecting OFDM transmission parameters based on a data rate and Quality of Service requested by an application and signaling to the application if the requested data rate and Quality of Service are not possible. The requested data rate and Quality of Service are mapped to a set of communications parameters, noise level on the OFDM subchannels is detected, and the application receives a signal if the communication parameters cannot be achieved given the noise conditions on the OFDM subchannels. The application can then decide whether it will renegotiate its requested data rate and Quality of Service, or wait until such request can be accommodated by the channel.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
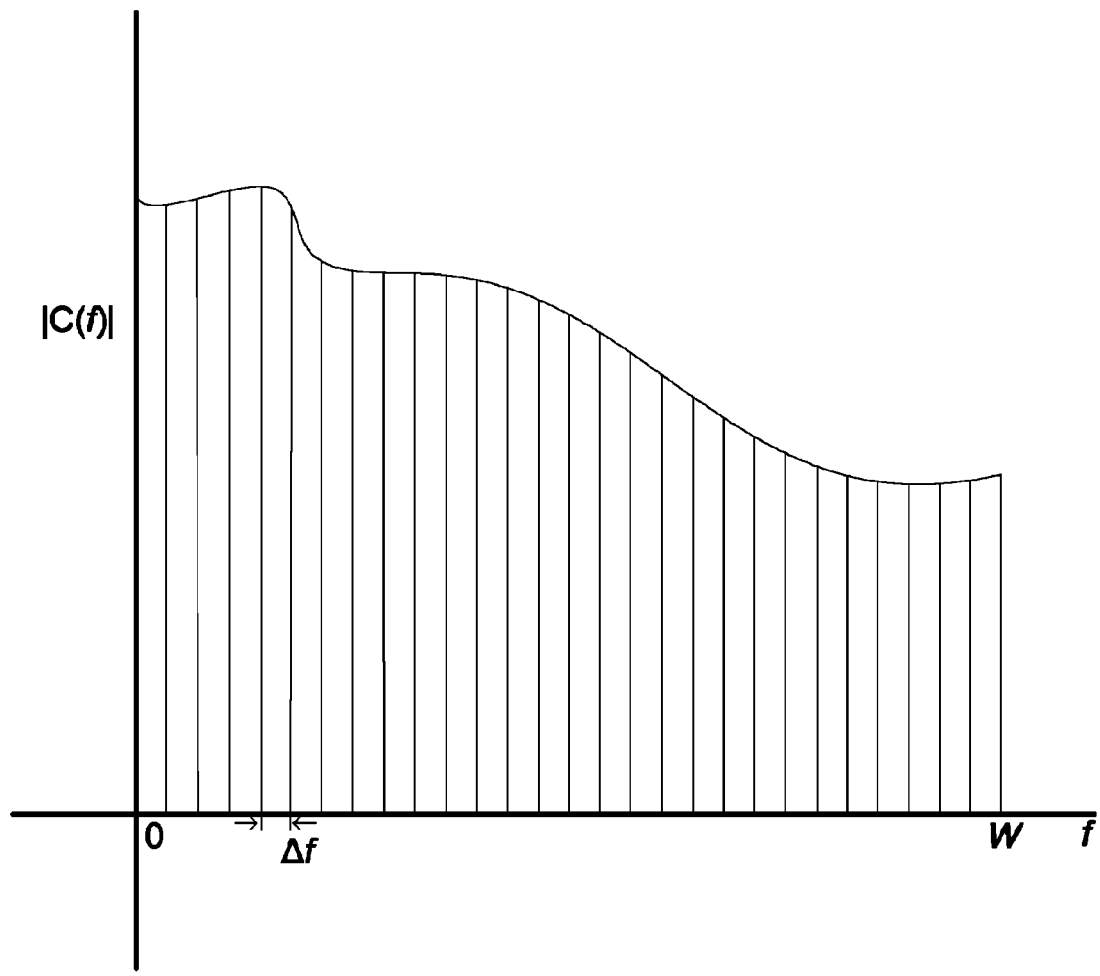
FIG. 1 is a spectrum diagram showing the subdivision of the channel bandwidth to be used into several subchannels of equal width.

This invention covers a novel method for wireless communication. According to the claimed invention, an application requests a data rate and Quality of Service. The system determines the number of subchannels, the quality of the subchannels, and the power for transmission on the subchannels necessary to achieve the requested data rate and QoS. If the transmission environment is such that the selected parameters are not achievable, the system can either modify the selected parameters or signal to the application through the stack that the requested service is not possible. The invention may be implemented in hardware or software, or some combination thereof. Software implementations, for example, could be in the operating system or in a device driver. Embodiments include a system, a method, and instructions stored in a computer-readable medium.

Computer readable media can be any available media that can be accessed by a computer. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, other types of volatile and non-volatile memory, any other medium which can be used to store the desired information and which can accessed by a computer, and any suitable combination of the foregoing.

The computer-readable media may be transportable such that the instructions stored thereon can be loaded onto any suitable computer system resource to implement the aspects of the present invention discussed herein. In addition, it should be appreciated that the instructions stored on the computer-readable medium, described above, are not limited to instructions embodied as part of an application program running on a host computer. Rather, the instructions may be embodied as any type of computer code (e.g., software or microcode) that can be employed to program a processor to implement the aspects of the present invention discussed below.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention may be embodied in either a wired OFDM communication system or a wireless OFDM communication system.

As shown in FIG. 1, in OFDM, the available channel bandwidth W is subdivided into a number of equal-bandwidth subchannels. Each subchannel is sufficiently narrow so that the frequency response characteristics of the subchannel are nearly ideal. The number of subchannels is the total available bandwidth divided by the bandwidth of each subchannel. The number of subchannels K can thus be expressed as:

$$K = \frac{W}{\Delta f}$$

Each subchannel k has an associated carrier wave. This carrier wave can be expressed as:

$$x_k(t) = \sin 2\pi f_k t$$

Where $x_k(t)$ is the carrier wave for subchannel k as a function of time t. $f_k$ is the mid-frequency of subchannel k, and k ranges from 0 to K−1. The phase of $x_k(t)$ is set to zero without losing generality.

The symbol rate 1/T is set for each subchannel to be equal to the separation $\Delta f$ of adjacent subcarriers. The subcarriers will thus be orthogonal over the symbol interval T, independent of the relative phase relationship between subcarriers. This relationship can be expressed as:

$$\int_0^T \sin(2\pi f_k t + \phi_k) \sin(2\pi f_j t + \phi_j) \, dt = 0$$

Where $f_k - f_j = n/T$, n=1, 2, ..., independent of the values of the (arbitrary) phases $\Phi_k$ and $\Phi_j$.

In an OFDM system, the symbol rate on each subchannel can be reduced relative to the symbol rate on a single carrier system that employs the entire bandwidth W and transmits data at the same rate as the OFDM system. Hence, the symbol interval T (the inverse of the symbol rate) in the OFDM system can be expressed as:

$$T = KT_s$$

where $T_s$ is the symbol interval of a single-carrier system employing the entire bandwidth W and transmitting data at the same rate as the OFDM system. For example, if the symbol rate across the entire bandwidth for one channel is 72 million symbols per second, and the channel is divided into 48 subchannels, each subchannel would only need to carry 1.5 million symbols per second to achieve the same total data rate. This lower symbol rate reduces inter-symbol interference and thus mitigates the effects of multipath fading. Accordingly, OFDM provides for superior link quality and robustness of communication.

In an OFDM system, the transmitter receives input data in the frequency domain and converts it to a time domain signal. A carrier wave is modulated by the time domain signal for wireless transmission or transmission over a wire. The receiver receives the signal, demodulates the wave, and converts the signal back to the frequency domain for further processing.

Figure 2:
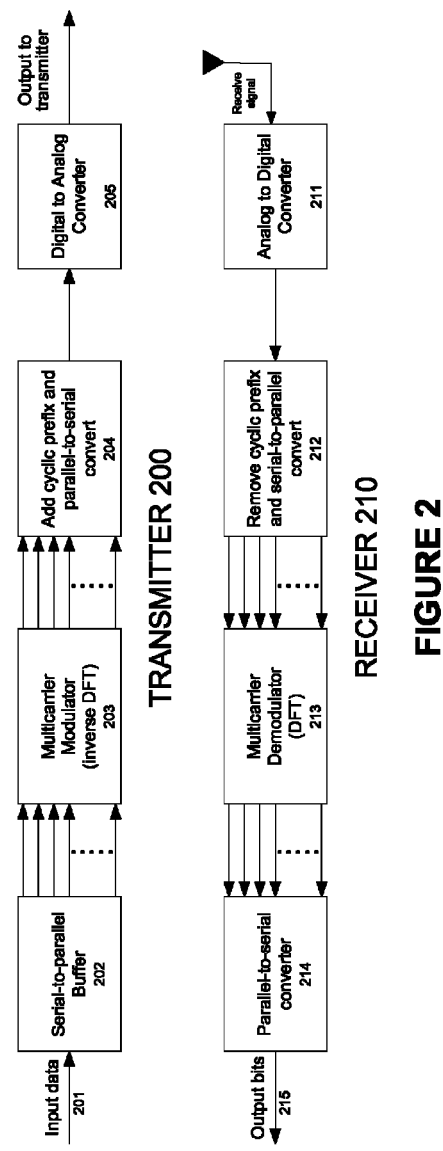
FIG. 2 is a block diagram of a multi-carrier OFDM digital communication system.

A simplified OFDM system is illustrated in FIG. 2. In the illustrated embodiment, the input data stream 201 is provided by the application to the OFDM transmitter 200. In a standard TCP/IP communications stack, this data could be received at the physical layer or data link layer; however, the invention is not limited to any particular source of data or mechanism for providing the data to the transmitter, and could be implemented in hardware or software, and at various layers of the network stack. The input data stream 201 is received by a serial-to-parallel buffer 202. The serial-to-parallel buffer 202 breaks the serial data stream up into several parallel data streams. The number of parallel data streams is equal to the number of subchannels available for OFDM broadcast, or K as used above.

In one embodiment, the serial-to-parallel buffer 202 divides the information sequence received from input data 201 into frames of $B_f$ bits. The $B_f$ bits in each frame are parsed into K groups, where the ith group is assigned $b_i$ bits. This relationship may be expressed as:

$$\sum_{i=1}^{K} b_i = B_f$$

Each of the parallel data streams generated by the serial-to-parallel buffer 202 is then sent to a multicarrier modulator 203. The multicarrier modulator 203 modulates each OFDM subcarrier with each of the parallel data streams. The multicarrier modulator 203 can be efficiently implemented by use of the Inverse Fast Fourier Transform (IFFT) algorithm to compute the time domain signal, although any algorithm may be used that converts a frequency domain signal to a time domain signal. Fast FFT algorithms have been the subject of research for decades, and there are numerous low complexity implementations that facilitate the implementation of OFDM systems.

The multicarrier modulator 203 may use any modulation scheme to modulate each of the incoming data streams. In preferred embodiments, the signals are modulated with phase shift keying (PSK) modulation, or quadrature amplitude modulation (QAM). Any PSK or QAM constellation may be used, such as those used in the wireless LAN family of standards, including 802.11a, 802.11g, and 802.11n. For example, the modulator may use 8PSK, 16-QAM, 64-QAM, 128-QAM or 256-QAM. A modulation scheme may be selected based on the required data rate, the available subchannels, the noise on each subchannel, or other factors.

In this example, the multicarrier modulator 203 thus generates K independent QAM subchannels, where the symbol rate for each subchannel is 1/T and the signal in each subchannel has a distinct QAM constellation. According to this example, the number of signal points for the ith subchannel can be expressed as:

$$M_i = 2^{b_i}$$

The complex-valued signal points corresponding to the information signals on each of the K subchannels can be represented as $X_k$, where k=0, 1, ..., K-1. These symbols $X_k$ represent the values of the Discrete Fourier Transform (DFT) of a multicarrier OFDM signal x(t), where the modulation on each subcarrier is QAM. Since x(t) must be a real-valued signal, its N-point DFT $X_k$ must satisfy the symmetry property. Therefore, the system creates N=2K symbols from K information symbols by defining:

$$X_{N-K} = X^*_K, k=1, 2, \ldots, K-1$$

$$X_0' = Re(X_0)$$

$$X_N = Im(X_o)$$

Here $X_0$ is split into two parts, both of which are real. The new sequence of symbols can be expressed as $X_k'$, where k=0, 1, ..., N-1. The N-point Inverse Direct Fourier Transform for each subchannel $x_n$ can thus be expressed as:

$$x_n = \frac{1}{\sqrt{N}} \sum_{k=0}^{N-1} X_k' \exp(j2\pi nk/N) \quad n = 0, 1, \ldots, N-1$$

In this equation, $$\frac{1}{\sqrt{N}}$$

is a scale factor. The sequence $x_n$ where $0 <= n <= N-1$ thus corresponds to samples of the multicarrier OFDM signal x(t), consisting of K subcarriers.

A cyclic prefix, which acts a guard interval, is added to each of the parallel modulated waves at 204. This guard interval insures that the subchannels will remain orthogonal, even if multipath fading causes the subcarriers to arrive at the receiver with some delay spread. The parallel streams with the cyclic prefix are then merged back into a single serial stream at 204. Finally, the digital data stream is converted to an analog signal 205, and output for wireless transmission.

The transmitted signal can be received by the receiver 210 and processed to recover the original data stream. First, the analog signal is converted back to a digital signal by an analog to digital converter 211. The cyclic prefix is removed and the separate subcarriers are converted back to separate streams at 212. Each parallel data stream is demodulated by a multicarrier demodulator 213, preferably with a Fast Fourier Transform (FFT) algorithm. Finally, at 214 the parallel streams are reassembled into a single serial stream and output to the receiving device 215.

Figure 3:
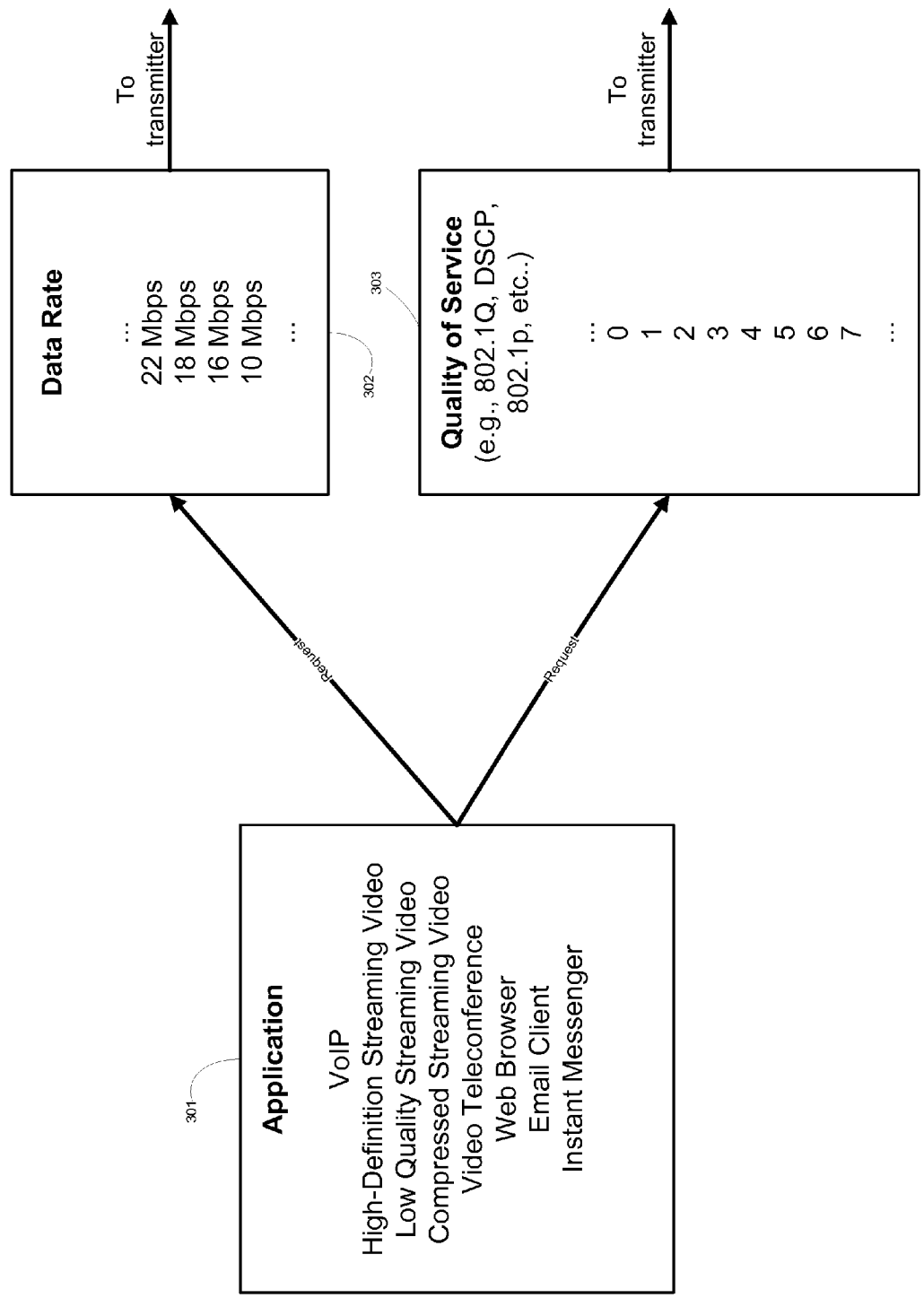
FIG. 3 is a flow diagram illustrating the selection by an application of a data rate and a Quality of Service.

As illustrated in FIG. 3, in one embodiment, an application 301 requests a data rate 302 and a Quality of Service 303 The application 301 can be any network application, including, for example, a Voice-over-IP client or a streaming video application. The data rate 302 and Quality of Service 303 requested by the application 301 may depend on the nature of the content to be transmitted. For example, high-definition video requires a higher data rate than simple voice or text communication. Voice-over-IP requires that latency or delay be less than a certain maximum amount. Communications relating to emergency services may require a very low error rate and high priority of transmission.

The requested data rate 302 is the data rate appropriate for the application 301. For example, a high definition video application could request a data rate of 22 Mbps, while an instant messenger client transmitting only text could request a much lower data rate.

Similarly, the Quality of Service 303 is the Quality of Service appropriate for the application 301. The Quality of Service can be any set of communications parameters, including, for example, parameters relating to performance, throughput, or latency. The IEEE 802.1p standard provides one example of a set of Quality of Service parameters. Under the IEEE 802.1p standard the following parameters are essential for providing a Quality of Service:

Service Availability
Frame loss
Frame missorder
Frame duplication
The transit delay experienced by frames
Frame lifetime
The undetected frame error rate
Maximum service data unit size supported
User priority
Throughput Under the IEEE 802.1Q standard, the requested QoS is set to a value between 0 and 7. Each such value corresponds to a delay and probability of error. In other embodiments, an in-band protocol header contains the QoS. For example, Differentiated Services Code Point (DSCP) is stored in the Type of Service (TOS) field in the IPv4 protocol header and in the Traffic Class field in the IPv6 header. A network can be configured such that DSCP-marked traffic can have differentiated levels of service. In another embodiment, the QoS may be encoded in an out-of-band state variable. According to the claimed invention, any method may be used for requesting a QoS.

Figure 4:
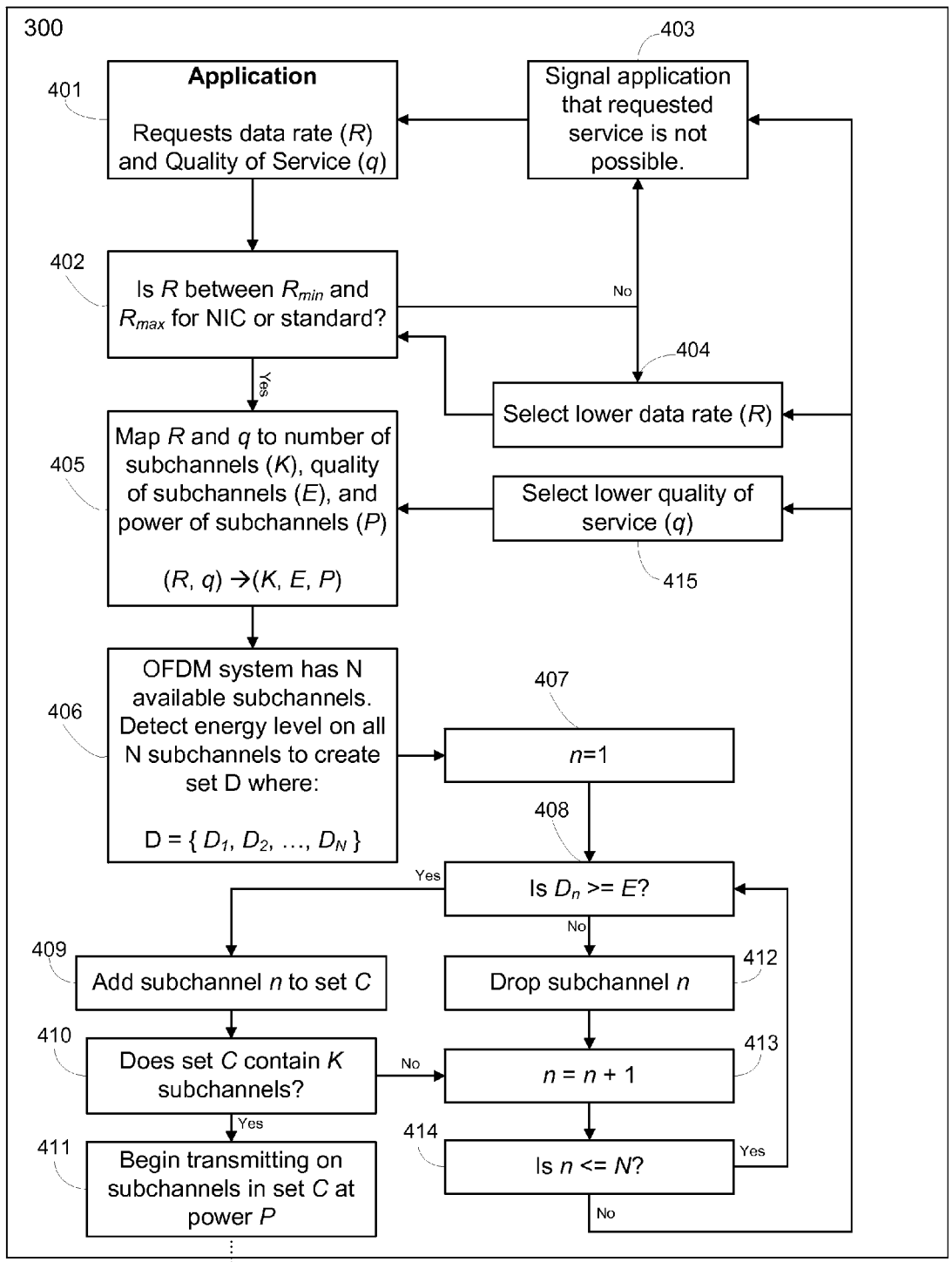
FIG. 4 is a flow diagram illustrating one embodiment of the invention.

FIG. 4 illustrates the steps taken in one embodiment in response to an application's request for a particular data rate and Quality of Service. In the discussion of FIG. 4, the steps described are implemented on a transmitter. The transmitter could be part of a network card, a device driver, or a component of an operating system. The invention is not limited to any particular implementation of a transmitter, whether hardware or software.

In the embodiment illustrated in FIG. 4, the application 401 requests a data rate R and a Quality of Service q. The network interface card (NIC) or wireless standard may have a minimum transfer rate $R_{min}$, a maximum transfer rate $R_{max}$, or both. For example, the following maximum rates apply to various IEEE 802.11 wireless standards:

| Wireless Standard | $R_{max}$ |
| --- | --- |
| 802.11b | 6 Mbps |
| 802.11a | 26 Mbps |
| 802.11n (20 MHz) | 100 Mbps |
| 802.11n (40 MHz) | 200 Mbps |

At 402, if $R_{min}$ or $R_{max}$ is defined for the NIC or wireless standard, the transmitter checks if the requested data rate R is between $R_{min}$ and $R_{max}$. This test can be expressed mathematically as:

$$R_{min} < R < R_{max}$$

If R is not an acceptable value, the transmitter can either signal to the application that the requested service is not possible at 403, or select another data rate at 404. The data rate selected at 404 may be the closest data rate to the requested data rate that is within the acceptable range $R_{min}$ to $R_{max}$.

If the requested data rate R is an acceptable value, at 405 the transmitter maps the requested data rate R and the requested QoS q to a number of OFDM subchannels K and a maximum energy level for each of those subchannels E. The number of subchannels K and maximum energy level E must be sufficient to meet the requested data rate R and QoS q. Optionally, the transmitter can include in the mapping the power level P for transmission on the K subchannels. Including a power level P is advantageous where the invention is implemented in a device that is limited by battery capacity, for example, a cell phone, Personal Digital Assistant (PDA), or laptop computer.

At 406, the transmitter detects the energy or noise level on all of the available subchannels. According to the embodiment in FIG. 4, the OFDM system provides for N subchannels. The detected energy level on each subchannel can be represented by the set D as follows:

$$D = \{D_1, D_2, \ldots, D_N\}$$

Where $D_1$ is the energy level detected on the first subchannel and $D_2$ is the energy level detected on the second subchannel, continuing on for all N subchannels.

At 407-414, the transmitter examines each value in set D to identify the subchannels whose noise level is below the required maximum noise level E. The transmitter begins the process at 407 by setting an index variable to the first value in set D. At 408, for the selected member of set D, the transmitter compares the energy level of the selected member with the threshold value E. If the subchannel has sufficiently low noise, it is added to set C at 409. If the noise is too high, the subchannel is dropped from consideration at 412. At 410, if set C has a sufficient number of subchannels to meet the requirement K established at 405, the transmitter can begin transmitting on the selected subchannels in set C at power P at 411. If the transmitter has not identified a sufficient number of subchannels meeting the criteria, at 413 the transmitter advances to the next subchannel and continues to test each subchannel until a sufficient number of subchannels are identified, repeating steps 408-414.

In an alternative embodiment, the transmitter detects energy on subchannels individually until it has identified a sufficient number of subchannels to meet the requirements established at 405.

At 414, if the detected energy level for all of the subchannels have been tested and the transmitter has not identified a sufficient number of subchannels to meet the criteria K and E (and optionally P) established at 405, the transmitter can take any of the following actions:

At 415, the transmitter can select a new value $q_{new}$ for the Quality of Service. $q_{new}$ can be any value less than q.

At 404, the transmitter can select a new value $r_{new}$ for the data rate. $r_{new}$ can be any value less than r.

The transmitter could select both a lower QoS $q_{new}$ at 415 and a lower data rate $r_{new}$ at 404.

At 403, the transmitter can signal the application 401 that the requested R and q are not possible in the current network environment.

One example of a means for signaling the application that the requested transmission characteristics are unavailable is the Generic QoS API (GQoS) implemented in the Microsoft Windows protocol stack, which provides feedback to the application regarding the status of the network.

In response to a notification that the requested transmission characteristics are unavailable, the application 401 can respond in several different ways. For example, if the content to be transmitted is streaming video, the application 401 might choose to transmit lower quality or more highly compressed video and thus request a lower data rate for the transmission. If the content to be transmitted is VoIP communications and a minimal QoS cannot be obtained, the application 401 might cancel the attempt to make a connection and notify the user that the communication is not possible, or alternatively it could select a higher compression level for the encoded audio and request a lower data rate R at the same QoS from the transmitter. In another embodiment, the application 401 could prompt the user that a high quality connection is not possible but ask the user whether the application 401 should attempt to communicate at a lower quality. In the case where the application attempts to create a connection with different transmission properties, the transmitter will repeat steps 402-415 with the newly requested properties.

Another aspect of the invention is the possibility of minimizing the packet assembly delay for time sensitive low data rate streams such as VoIP traffic by attempting to minimize the number of OFDM subchannels allocated for transmission. In typical high data rate OFDM systems the OFDM symbol size exceeds the size of a VoIP packet. Commonly-implemented methods to address this issue are (1) the transmitter may send a nearly empty OFDM symbol or (2) the transmitter accumulates enough voice packets to transmit a full OFDM symbol before sending. In case (1), the overall efficiency of spectrum use is reduced while in case (2) audio quality is diminished due to the increased latency from the transmitter waiting for enough packets to accumulate to transmit a full symbol.

In order to better accommodate VoIP traffic, the mapping at 405 can attempt to minimize the number of subchannels to be used K. In this embodiment, the specific transmission requirements of VoIP are satisfied without sacrificing high spectral efficiency. This embodiment could be implemented at the operating system level, where the operating system would request a certain data rate that is derived from the application along with the delay requirements. The subchannel mapping that occurs at 405-414 chooses the number of subchannels to match the requirements and channel conditions.

Figure 5:
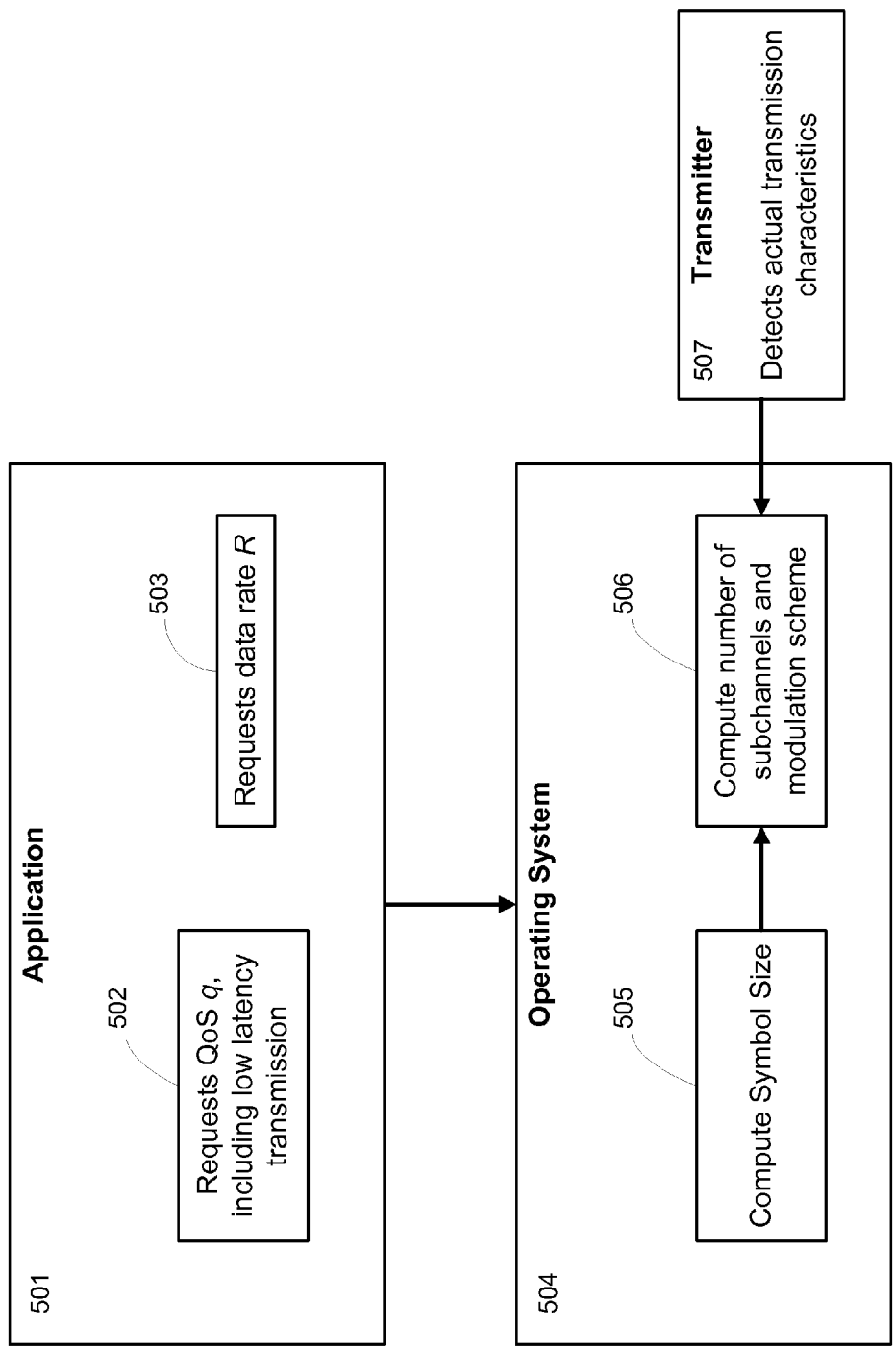
FIG. 5 is a flow diagram illustrating some aspects of the invention.

As illustrated in FIG. 5, in this embodiment, the operating system takes the following steps in response to a request from the application to optimize transmission characteristics to accommodate network traffic that requires low latency but does not require a full OFDM symbol to transmit at the requested rate:

- The application 501 requests a QoS q at 502, where that QoS includes low latency transmission (as for VoIP traffic) and a data rate R at 503.
- At 505, the Operating System 504 computes the size of the symbol (number of bytes) based on the data rate and the maximum packetization delay for the data stream.
- At 506, the Operating System computes the number of subchannels and the modulation scheme needed for transmitting the symbols given the channel conditions.
- The Operating System continuously adjusts the modulation scheme and number of subchannels based on feedback from the transmitter 507.

Although VoIP is used as an illustrative example in this aspect of the invention, this aspect of the claimed invention can be applied in response to a request for transmission from any application that sends network packets smaller than a full OFDM symbol at the requested rate.

In yet another aspect of the invention the transmitter receives feedback from the receiver based on successful transmissions. This feedback could be, for example, in the form of acknowledgement packets. If no acknowledgement packets are received by the transmitter despite multiple retransmission attempts, the transmitter can conclude that the energy level given the modulation scheme is insufficient. In order to maintain the requested QoS, the transmitter can add subchannels dynamically to the set C of subchannels used for transmission. Another alternative approach in case the feedback indicates successful transmission is to lower the modulation scheme used. By selecting a lower order modulation scheme, the transmitter can achieve more robust transmission. Similarly, the lack of transmission errors over an extended period of time may be used to reduce the numbers of subchannels or increase the modulation to a higher order modulation scheme.

In another embodiment, the number of subchannels K is held constant but the transmitter selects the energy level based on the requested QoS. In this embodiment, high priority data streams are transmitted in a more robust way. For example, applications requesting QoS priority 7 under the IEEE 802.1Q standard typically transmit network control traffic, while priority 6 is used for VoIP traffic. Under IEEE 802.1Q, both priorities 6 and 7 require highly reliable transmission and low delay respectively. The transmitter selects robust transmission characteristics in response to the requested priorities, thus reducing the chance of packet errors and thus retransmissions. These characteristics could include a lower data rate or higher power transmission.

In another embodiment, an out-of-band channel is available for communication between the transmitter-receiver pair. For example, a dual band wireless access point may communicate with a dual band client. This communication could occur in the 802.11a (5 GHz) band. When the transmitter cannot identify a sufficient number of subchannels below the required energy threshold to achieve the requested QoS and data rate, the transmitter may select one of two solutions. The first solution is the preferred embodiment discussed above, wherein the transmitter signals to the application that the requested transmission characteristics are not possible, and the application may then alter the requested parameters as shown in FIG. 4. The second solution relies on the availability of reliable out-of-band signaling, as in a dual band wireless access point. In this embodiment, the application at the transmitter end of the connection can signal the application on the receiver end of the connection using the 2.4 GHz band at the lowest order modulation scheme. The signal sent from the transmitter to the receiver indicates that a requested QoS is not possible in the network environment. In this case, the receiver application may be able to accommodate a lower QoS, or the receiver may have a better signal-to-noise ratio than that detected by the transmitter. The receiver may then signal the transmitter to begin transmitting despite the energy levels detected by the transmitter.

Figure 6:
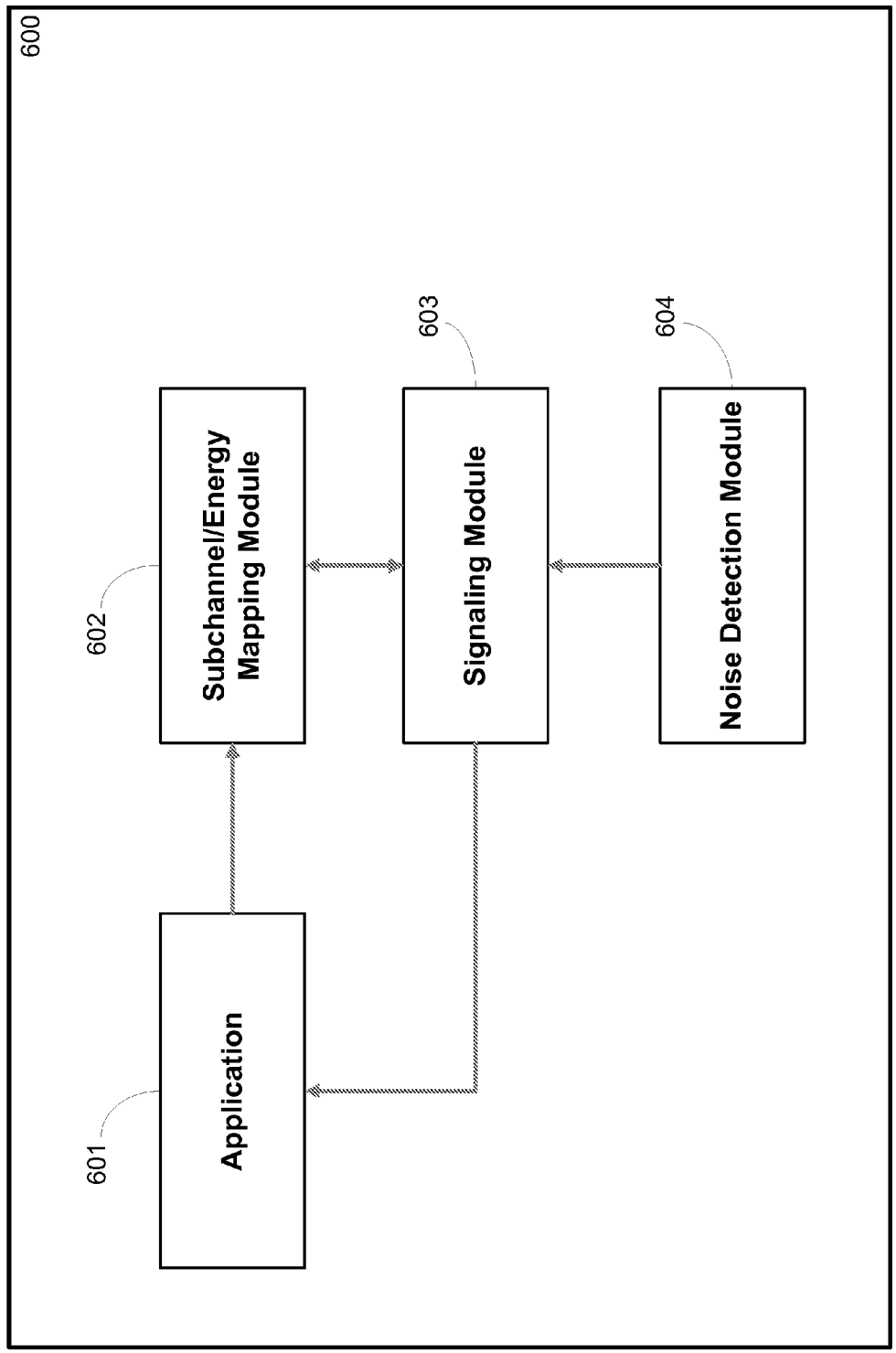
FIG. 6 is a flow diagram illustrating a system implementing some aspects of the invention.

FIG. 6 illustrates another embodiment of the invention. FIG. 6 shows a system 600 comprising an application 601, a subchannel/energy mapping module 602, a signaling module 603, and a noise detection module 604. The application 601 requests a data rate and QoS. The subchannel/energy mapping module 602 maps the requested data rate and QoS to a number of subchannels K and an energy threshold E. Independently, the noise detection module 604 detects the energy level on the available OFDM subchannels. The signaling module 603 processes the output of the noise detection module 604 and the subchannel/energy mapping module 602 to determine whether there are enough subchannels whose noise level is below the energy threshold E to meet the requirement of K subchannels. If the signaling module 603 determines that there are insufficient subchannels, it can either signal the subchannel/energy mapping module 602 to select different requirements, or it can signal the application 601 that the requested transmission characteristics are not available.

In another embodiment, the communication occurs over wires. The communication may occur over an Asymmetric Digital Subscriber Line (ADSL) system, over power lines, or over any other wired communication system implementing OFDM modulation.

In yet another embodiment, the invention relates to a computer-readable medium having computer-executable instructions for performing steps. The steps include receiving a requested data rate and Quality of Service from an application, mapping the requested transmission characteristics into a minimum number of subchannels, an energy threshold, and optionally the transmission power, identifying subchannels whose energy is below the required energy threshold, and signaling the application in the event that a sufficient number of subchannels cannot be identified.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of operating a computer to initiate a communication at a performance level requested by an application executing on the computer in conjunction with an operating system of the computer, the application generating data for transmission, the method comprising:
operating the computer to perform the acts of:
a) receiving in a component of the computer separate from the application a request from the application of the computer to initiate the communication at the performance level;
b) within the component, mapping the requested performance level to a set of communications parameters, wherein the mapping comprises determining a noise level and how many subchannels of a plurality of subchannels are required to meet the requested performance level;
c) when a number of available subchannels having the energy level below the noise level is less than the determined number of subchannels required to meet the requested performance level, by the computer:
i) sending a signal to the application; and
ii) in response to the signal, increasing compression used within the application to represent the data; and
d) when the number of available subchannels having the energy level below the noise level is not less than the determined number of subchannels required to meet the requested performance level, communicating, by the computer, the data from the application using a set of subchannels of the plurality of subchannels, the set containing a number of subchannels selected based on the determining of how many subchannels are required, the number of subchannels contained in the set being less than the number of available subchannels having the energy level below the noise level.

2. The method of claim 1, wherein the communication is wireless.

3. The method of claim 1, wherein the communication occurs over wires.

4. The method of claim 1, wherein the performance level consists of a data rate and a Quality of Service (QoS).

5. The method of claim 1, wherein the application is a VoIP application.

6. The method of claim 1, wherein the mapping comprises selecting subchannels from the plurality of subchannels.

7. The method of claim 1, wherein the communications parameters include a power level of transmission.

8. The method of claim 1, wherein the plurality of subchannels are subcarriers of an OFDM system.

9. The method of claim 4, further comprising the act of selecting a lower data rate and repeating acts (a) and (b) prior to sending the signal in act (c) if said the communication parameters are not available.

10. The method of claim 1, wherein the mapping in act (b) minimizes the number of subchannels required to meet the requested performance level.

11. A wireless transmission system configured for transmitting data in response to a request from an application to transmit at a data rate and Quality of Service (QoS), the wireless transmission system comprising:
a computer having a network interface, the computer comprising:
a signaling module configured for determining whether a number of available subchannels each having an energy level below a noise level is less than a number of subchannels determined to be needed to meet the requested data rate and Quality of Service (QoS),
wherein the signaling module configured for signaling the application that the requested data rate and Quality of Service (QoS) are not available in response to determining that the number of available subchannels from the plurality of available subchannels having the energy level below the noise level is less than the determined number of subchannels required to meet the requested data rate and Quality of Service (QoS).

12. The system of claim 11, wherein the application is a Voice-over-IP client, a streaming multimedia application, an Internet web browser, or an instant messenger client.

13. The system of claim 11, wherein the wireless transmission system is an OFDM system.

14. The system of claim 11, wherein:
the system further comprises a subchannel/energy mapping module configured for responding to a signal from the signaling module that the requested data rate and Quality of Service (QoS) are not available by selecting a higher energy threshold and
the signaling module also configured for signaling the subchannel/energy mapping module when the requested data rate and Quality of Service (QoS) are not available.

15. The system of claim 14, the subchannel/energy mapping module also configured for determining a power level for transmission.

16. The system of claim 11, wherein the application comprises a streaming multimedia application executing on the computer and the application is configured for increasing the compression of a stream when the requested data rate and Quality of Service (QoS) are not available.

17. A computer storage device having stored thereon computer-readable instructions that, as a result of being executed by a computer having an operating system, instruct the computer to perform a method of wireless communication, the method comprising:
a) receiving from a transmitting application executed by the computer a request for a data rate and Quality of Service (QoS) required to send data to a receiving application;
b) within the operating system of the computer, detecting an energy level on each available subchannel;
c) within the computer, attempting to select a number of subchannels from a plurality of subchannels having the energy level on the subchannels below a noise level that are available to meet the requested data rate and Quality of Service (QoS);
d) when the number of subchannels having the energy level below the noise level is not sufficient to meet the requested data rate and Quality of Service (QoS), by the computer:
signaling to the transmitting application that a number of available subchannels having the energy level below the noise level is insufficient to achieve the requested data rate and Quality of Service (QoS);
signaling, by the transmitting application, to the receiving application to indicate that the requested Quality of Service (QoS) is not available; and
receiving from the receiving application, at the transmitting application, an indication that the receiving application accommodates a lower Quality of Service (QoS) to receive the data; and
communicating, from the transmitting application, with the receiving application using the lower Quality of Service (QoS);

e) when the number of available subchannels having the energy level below the energy threshold is sufficient to meet the requested data rate and Quality of Service (QoS), by the computer:
   communicating, from the transmitting application, with the receiving application using the Quality of Service (QoS) using a set containing a number of subchannels, the number of subchannels of the set being less than the number of subchannels having the energy level below the noise level, that is determined to be sufficient to meet the requested data rate and Quality of Service (QoS).

18. The computer storage device of claim 17, wherein the method further comprises selecting a power level for transmission.

19. The computer storage device of claim 18, wherein the selected power level is a minimum possible power level to successfully transmit at the requested data rate and Quality of Service (QoS).

20. The computer storage device of claim 17, wherein the selection of the number of subchannels below the noise level is done using feedback from a receiver.

* * * * *